(12) United States Patent
Alagappan et al.

(10) Patent No.: US 12,241,920 B2
(45) Date of Patent: Mar. 4, 2025

(54) FREQUENCY MONITORING CIRCUITRY WITH VOLTAGE CONVERSION

(71) Applicant: Apple Inc., Cupertino, CA (US)

(72) Inventors: Arunvenkatesh Alagappan, Cupertino, CA (US); Soheil Golara, San Jose, CA (US); Seyedeh Sedigheh Hashemi, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 156 days.

(21) Appl. No.: 17/986,612

(22) Filed: Nov. 14, 2022

(65) Prior Publication Data

US 2024/0110959 A1 Apr. 4, 2024

Related U.S. Application Data

(60) Provisional application No. 63/408,782, filed on Sep. 21, 2022.

(51) Int. Cl.
*G01R 23/02* (2006.01)
*G01R 23/09* (2006.01)
*G01R 23/10* (2006.01)
*H03K 21/02* (2006.01)

(52) U.S. Cl.
CPC ............ *G01R 23/02* (2013.01); *G01R 23/09* (2013.01); *G01R 23/10* (2013.01); *H03K 21/02* (2013.01)

(58) Field of Classification Search
CPC ........ G01R 23/02; G01R 23/10; G01R 23/09; H03K 21/02
USPC ...................................................... 324/76.14
See application file for complete search history.

(56) References Cited

U.S. PATENT DOCUMENTS

| 3,812,427 | A | 5/1974 | Coulter |
| 4,257,003 | A | 3/1981 | Yool |
| 5,159,615 | A | 10/1992 | Clark |
| 5,471,402 | A | 11/1995 | Owen |
| 7,242,223 | B1 | 7/2007 | Alon |
| 2004/0183613 | A1* | 9/2004 | Kurd .................. G01K 7/32 331/186 |
| 2005/0184764 | A1* | 8/2005 | Kurd ................ G01R 31/275 327/99 |
| 2006/0224910 | A1 | 10/2006 | Li et al. |

(Continued)

FOREIGN PATENT DOCUMENTS

KR 20080050210 A 6/2008

*Primary Examiner* — Raul J Rios Russo
(74) *Attorney, Agent, or Firm* — Treyz Law Group; Jason Tsai

(57) ABSTRACT

An integrated circuit can include frequency monitoring circuitry. The frequency monitoring circuitry may include a voltage based frequency monitoring circuit for monitoring an input clock signal having an input clock frequency within a first set of frequencies and a coarse frequency monitoring circuit for monitoring an input clock signal having an input clock frequency within a second set of frequencies different than the first set of frequencies. The voltage based frequency monitoring circuit can be configured to generate an output voltage having a first value when the input clock frequency is greater than a reference frequency and having a second value when the input clock frequency is less than the reference frequency. The coarse frequency monitoring circuit can include a reference counter and an input clock counter that generates a count value used to compute the input clock frequency.

20 Claims, 13 Drawing Sheets

(56) References Cited

U.S. PATENT DOCUMENTS

| | | | |
|---|---|---|---|
| 2008/0152065 A1* | 6/2008 | Okumura | G01R 23/15 |
| | | | 375/373 |
| 2011/0062994 A1 | 3/2011 | Kusunoki | |
| 2014/0159776 A1 | 6/2014 | Elran | |
| 2016/0359476 A1 | 12/2016 | Yu et al. | |
| 2020/0162081 A1* | 5/2020 | Jayakumar | H03L 7/093 |
| 2022/0099713 A1* | 3/2022 | Ozalevli | H02M 3/156 |

* cited by examiner

FREQUENCY MONITORING CIRCUITRY WITH VOLTAGE CONVERSION

This application claims the benefit of U.S. Provisional Patent Application No. 63/408,782, filed Sep. 21, 2022, which is hereby incorporated by reference herein in its entirety.

FIELD

Embodiments described herein relate generally to integrated circuits and, more particularly, to integrated circuits with a frequency monitoring circuit.

BACKGROUND

Integrated circuits can include a frequency monitoring circuit for monitoring the frequency of an input clock signal. Conventional frequency monitoring circuits typically include a high precision low frequency oscillator that generates a reference clock signal. The reference clock signal can control a reference clock counter, whereas the input clock signal can control an input clock counter. The frequency of the input clock signal can then be computed based on count values of the reference clock counter and the input clock counter and the frequency of the reference clock signal.

It can be challenging to design frequency monitoring circuits. For instance, the resolution of the conventional frequency monitoring circuits can be increased by reducing the frequency of the reference clock signal or by increasing the bit width of the clock counters, both of which increase the overall latency. It is within this context that the embodiments herein arise.

SUMMARY

An electronic device may include an integrated circuit having frequency monitoring circuitry configured to monitor or measurement the frequency of an input clock signal. The frequency monitoring circuitry can include a voltage based frequency monitoring circuit and a coarse frequency monitoring circuit coupled to a digital output logic. The voltage based frequency monitor can perform fast frequency detection to determine whether the frequency of the input clock signal is greater than or less than a frequency threshold. The coarse frequency monitoring circuit can be used to perform frequency detection at extreme frequencies.

The voltage based frequency monitoring circuit can include a comparator having a first comparator input and a second comparator input, a capacitor coupled to the first comparator input, a resistor selectively coupled to the second comparator input, and a current source configured to provide a reference current to the capacitor during a first time period and to provide the reference current to the resistor during a second time period different than the first time period. The voltage based frequency monitoring circuit can optionally include a first switch coupled between the current source and the capacitor, a second switch coupled between the current source and the resistor, a third switch coupled between the resistor and the second comparator input, a fourth switch configured to reset the capacitor, an additional capacitor coupled to the second comparator input, and/or a clock phase generator configured to receive an input clock signal having an input clock frequency and configured to output signals for controlling the first, second, third, and fourth switches. The comparator can output a first voltage in response to detecting that the input clock frequency is greater than a reference frequency and can output a second voltage different than the first voltage in response to detecting that the input clock frequency is less than the reference frequency.

The voltage based frequency monitoring circuit can optionally include clock dithering circuitry configured to dither the input clock signal that is provided to the clock phase generator. If desired, the voltage based frequency monitoring circuit can optionally include a first autozero switch coupled across the second comparator input and an output of the comparator, a second autozero switch having a first terminal coupled to the first comparator input and having a second terminal coupled to the second comparator input, and an autozero capacitor coupled to the second comparator input. If desired, the voltage based frequency monitoring circuit can optionally include a trimming circuit configured to tune the capacitor using a calibrated setting, a self-test circuit configured to selectively couple the second comparator input to a respective tap point along a resistive ladder, a reset pulse generator coupled to the comparator and configured to generate an output signal for discharging the capacitor, and/or a dynamic element matching circuit configured to selectively provide two different reference currents to the capacitor and the resistor.

The coarse frequency monitoring circuit can be configured to receive the input clock signal and to output one or more count values. The digital output logic can generate a digital output based on an output voltage from the voltage based frequency monitoring circuit when the input clock frequency is within a first set of frequencies and based on the one or more count values from the coarse frequency monitoring circuit when the input clock frequency is within a second set of frequencies different than the first set of frequencies. The coarse frequency monitoring circuit can include a reference counter configured to receive a reference clock signal and to output a done signal and an input clock counter configured to receive the input clock signal, to receive the done signal from the reference counter, and to generate a count value that is used to compute the input clock frequency. A ring oscillator can be used to generate the reference clock signal.

Further features of the invention, its nature and various advantages will be more apparent from the accompanying drawings and following detailed description.

DETAILED DESCRIPTION

This relates to an integrated circuit having frequency monitoring circuitry. The frequency monitoring circuitry may include a voltage based frequency monitoring circuit and a coarse frequency monitoring circuit. The voltage based frequency monitoring circuit can convert a frequency to a voltage, which enables fast frequency monitoring. The coarse frequency monitoring circuit uses a digital counter to perform fast frequency monitoring at higher frequencies. The combination of voltage based frequency monitoring and coarse frequency monitoring provides fast frequency monitoring across a wide range of frequencies.

The voltage based frequency monitoring circuit may include a comparator having inputs coupled to capacitive and resistive components and associated switches. The voltage based frequency monitoring circuit can be operable in a charging phase, a comparison phase, and a reset phase. The comparator may have an output coupled to a digital majority voting circuit or an analog-to-digital converter. The voltage based frequency monitoring circuit can include a temperature compensated resistor that includes a combination of a poly resistor and a metal resistor. The comparator can be autozeroed to mitigate comparator offset drift and flicker noise. The clock signals controlling the switches in the voltage based frequency monitoring circuit can be dithered to help reject power supply noise. The capacitive components within the voltage based frequency monitoring circuit can be trimmed to a known reference frequency. A self-test circuit can be used to check the values of the capacitive and resistive components. Alternatively, the voltage based frequency monitoring circuit can optionally be configured as a relaxation oscillator to check the values of the capacitive and resistive components.

Figure 1:
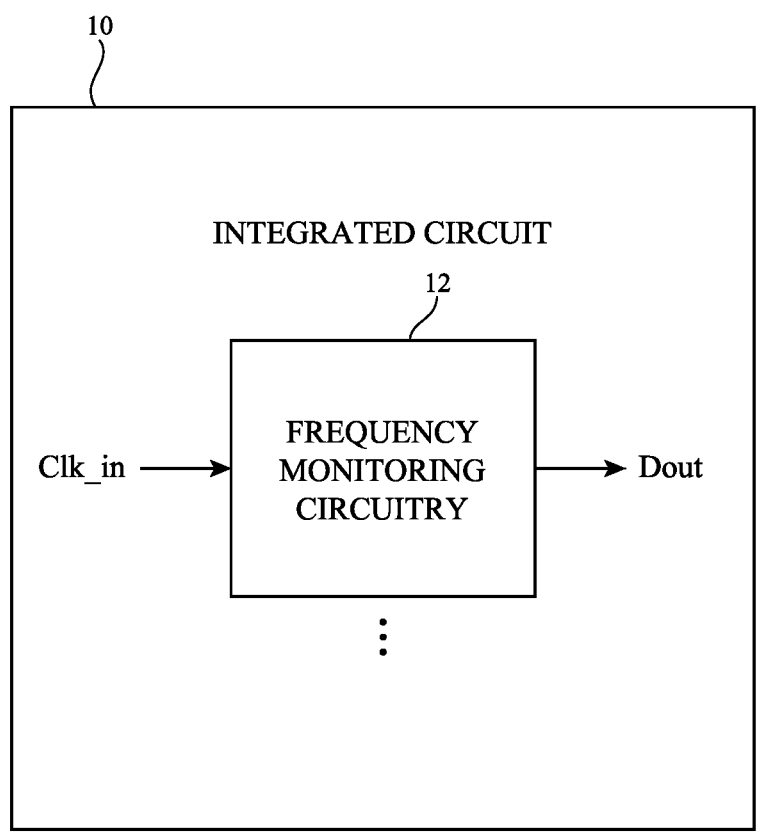
FIG. 1 is a diagram of an illustrative integrated circuit that includes frequency monitoring circuitry in accordance with some embodiments.

FIG. 1 is a diagram of an illustrative integrated circuit device such as integrated circuit 10 having a frequency monitoring system such as frequency monitoring circuitry 12. As shown in FIG. 1, frequency monitoring circuitry 12 may have an input configured to receive an input clock signal Clk_in and an output on which a corresponding digital value Dout is generated. Input clock signal Clk_in may represent a clock signal to be monitored and can be an external clock signal (e.g., a clock signal received off-chip from another integrated circuit device, a clock signal generated from a phased-locked loop, a recovered clock signal, or other internal clock signal generated from some component within device 10. Frequency monitoring circuitry 12 may output a digital Dout value. For example, frequency monitoring circuitry 12 can assert Dout (e.g., drive Dout high or to a logic "1") upon detecting that the frequency of Clk_in is above a predefined threshold frequency and can deasserted Dout (e.g., drive Dout low or to a logic "0") upon detecting that the frequency of Clk_in is below the predefined threshold frequency. The example of FIG. 1 in which device 10 includes one frequency monitoring circuitry is merely illustrative. In general, integrated circuit device 10 may include a frequency monitoring system that can monitor any suitable number of clock signals.

Figure 2:
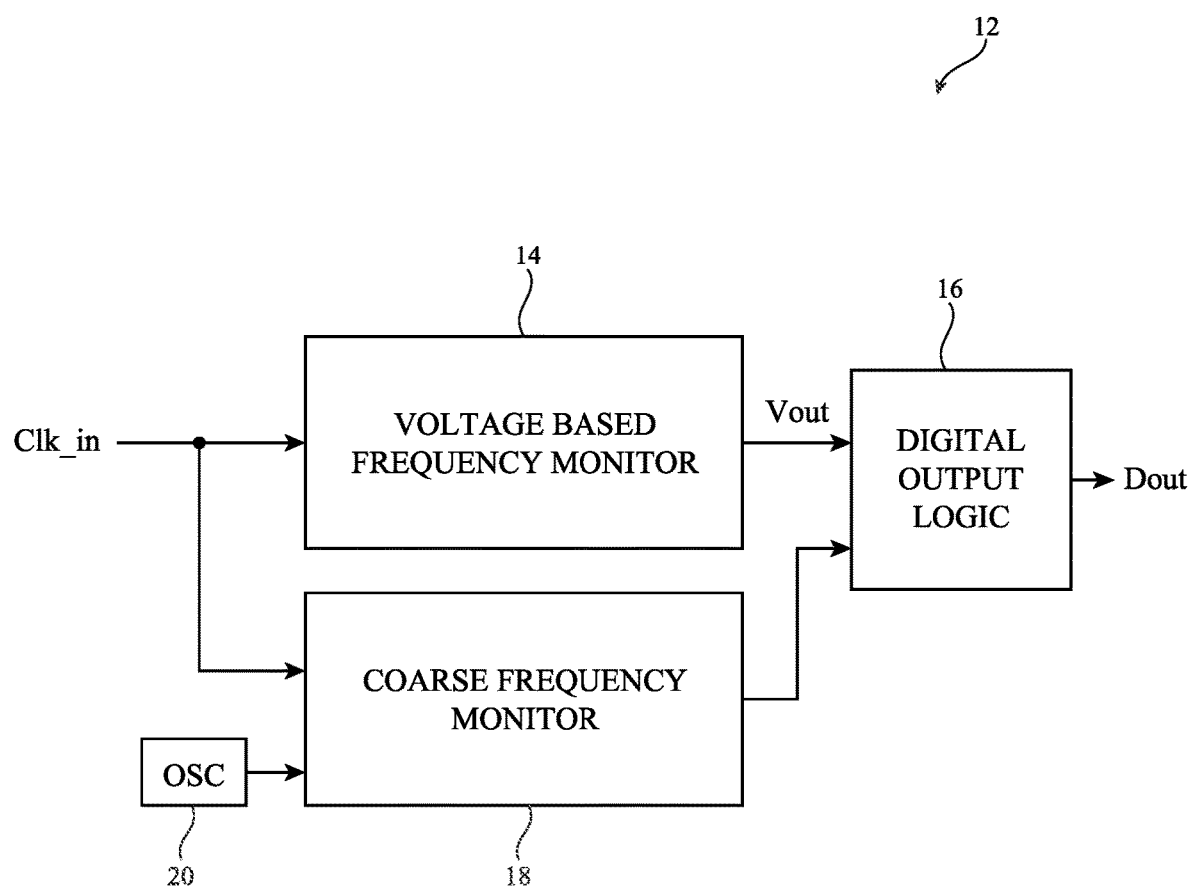
FIG. 2 is a block diagram of illustrative frequency monitoring circuitry having a voltage based frequency monitoring circuit and a coarse frequency monitoring circuit in accordance with some embodiments.

FIG. 2 is a block diagram of illustrative frequency monitoring circuitry 12. As shown in FIG. 2, frequency monitoring circuitry 12 may include a voltage based frequency monitoring circuit such as voltage based frequency monitoring circuit 14, an accompanying coarse frequency monitoring circuit such as coarse frequency monitoring circuit 18, and an output logic circuit such as digital output logic 16. Voltage based frequency monitoring circuit 14 may have an input configured to receive input clock signal Clk_in and an output coupled to digital output logic 16. Voltage based frequency monitoring circuit 14 can be configured to convert input clock signal Clk_in into a corresponding output voltage Vout having a value that is proportional to (i.e., dependent or based on) the frequency of signal Clk_in. Frequency monitoring circuit 14 is therefore sometimes referred to as having a frequency-to-voltage conversion functionality. Use of frequency-to-voltage conversion or a voltage based frequency monitoring scheme can allow accurate frequency measurements that are faster than conventional frequency monitoring methods that rely on merely counting the number of the cycles in the input clock against a precise low frequency clock signal. Voltage based frequency monitoring circuit 14 can sometimes be referred to and defined as a frequency-to-voltage converter (FVC).

Coarse frequency monitoring circuit 18 may have a first input configured to receive input clock signal Clk_in, a second input configured to receive a reference clock signal from an oscillator circuit such as local oscillator 20, and an output that is coupled to digital output logic 16. Coarse frequency monitoring circuit 18 can help cover frequency ranges where voltage based frequency monitoring circuit 14 might not operate properly. For example, coarse frequency monitoring circuit 18 can help measure input clock signal Clk_in having very low frequencies (e.g., close to 0 Hz) and at very high frequencies (e.g., close to the maximum operating frequency fmax). At these extreme frequencies, the voltage based frequency monitoring circuit 14 might not be reliable or might take too long. Thus, digital output logic 16 may select between the output of monitoring circuit 14 and monitoring circuit 18 depending on the frequency range of input clock signal Clk_in. At the extreme frequencies, the result from coarse frequency monitor 18 can be selected for output (while bypassing or ignoring the result from voltage based monitor 14). Otherwise, the result from the voltage based frequency monitor 18 can be selected for output (while bypassing or ignoring the result from coarse monitor 18).

Figure 3:
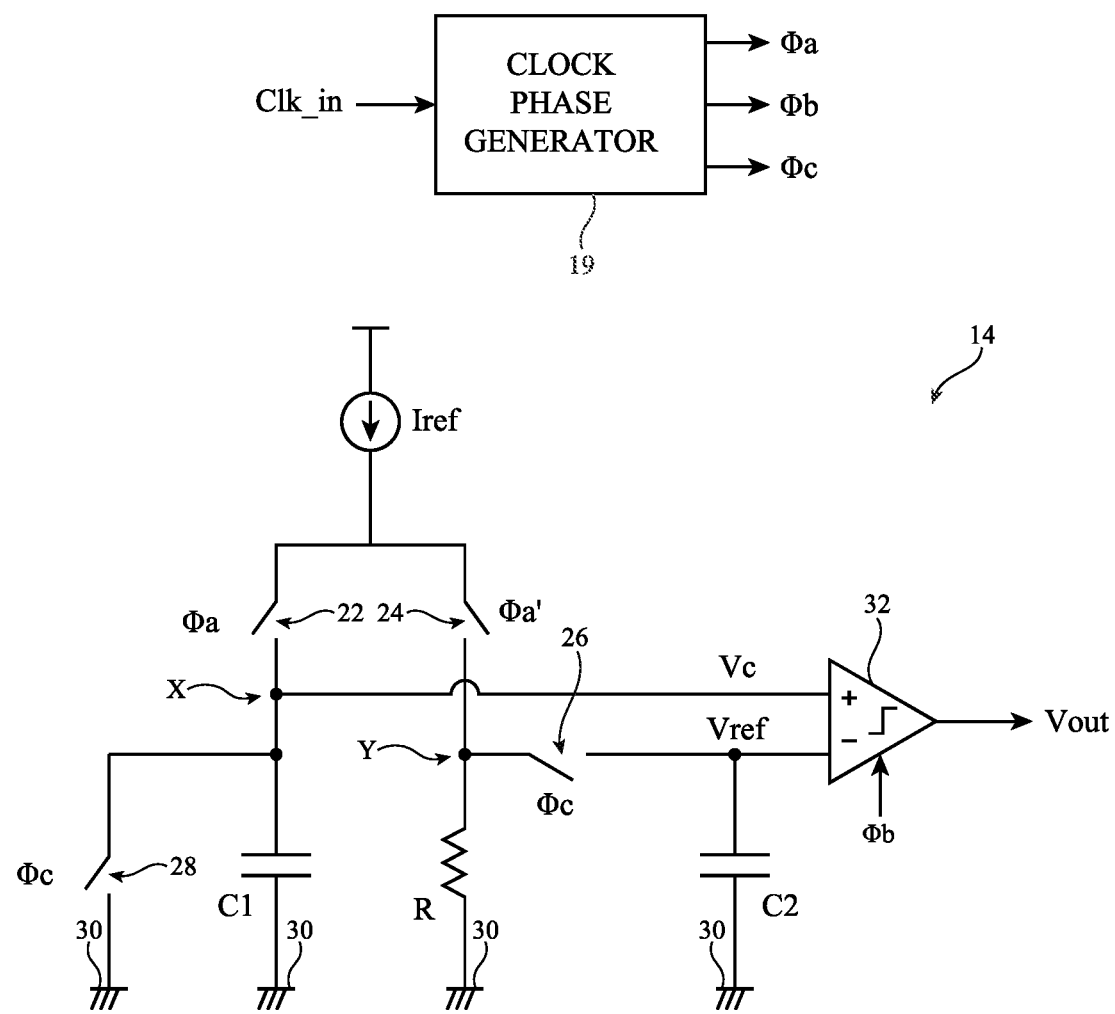
FIG. 3 is a circuit diagram of an illustrative voltage based frequency monitoring circuit in accordance with some embodiments.

FIG. 3 is a circuit diagram of illustrative voltage based frequency monitoring circuit 14 (e.g., a frequency-to-voltage converter). As shown in FIG. 3, voltage based frequency monitoring circuit 14 may include a comparator circuit such as comparator 32, passive components such as resistor R and capacitors C1 and C2, and associated switches 22, 24, 26, and 28. Comparator 32 has a first (positive) input coupled to node X, a second (negative) input selectively coupled to node Y via switch 26, and an output on which output voltage Vout can be generated. The first and second inputs of comparator 32 may be referred to as first and second comparator inputs. A voltage Vc can be provided on node X to the first (+) input of comparator 32. A reference voltage Vref can be provided to the second (−) input of comparator 32. Switch 26 can be selectively activated by control signal φc (e.g., signal φc can be asserted to turn on switch 26 and can be deasserted to turn off switch 26). Comparator 32 can itself be controlled by control signal φb. When signal φb is asserted, comparator 32 may perform a comparison operation that drives Vout high when Vc exceeds Vref and that drives Vout low when Vc falls below Vref. When signal φb is deasserted, comparator 32 may be idle.

Node X may selectively receive a reference current Iref via switch 22. Reference current Iref may be provided from a reference current source. Switch 22 can be selectively activated by control signal φa (e.g., signal φa can be asserted to turn on switch 22 and can be deasserted to turn off switch 22). Capacitor C1 has a first terminal coupled to node X and a second terminal coupled to a ground power supply line 30 (e.g., a ground line on which a ground voltage is provided). When switch 22 is turned on, current Iref will charge up capacitor C1, and the voltage stored on capacitor C1 will increase linearly for as switch 22 is turned on. The charging of capacitor C1 effectively converts φa, which is a function of input clock signal Clk_in, to voltage signal Vc. Switch 28 may be coupled in a parallel with capacitor C1. Switch 28 can be selectively activated by control signal φc (e.g., signal φc can be asserted to turn on switch 28 and can be deasserted to turn off switch 28). Activating switch 28 can reset the charge stored on capacitor C1 to zero volts. Switch 28 is therefore sometimes referred to as a reset or discharge switch.

Node Y may selectively receive the reference current Iref via switch 24. Switch 24 can be selectively activated by control signal φa' (e.g., signal φa' can be asserted to turn on switch 24 and can be deasserted to turn off switch 24). Signal φa' may be an inverted version of signal φa. Thus, only one of switches 22 and 24 can be turned on at any given point in time (e.g., when switch 22 is enabled, switch 24 will be disabled and vice versa). Resistor R has a first terminal coupled to node Y and a second terminal coupled to ground line 30. When switch 24 is turned on, current Iref will flow through resistor R and generate reference voltage Vref on node Y. The reference voltage on node Y will be provided to the second (−) input terminal of comparator 32 only when switch 26 is turned on (e.g., when signal φc is asserted). Capacitor C2 can have a first terminal coupled to the second input of comparator 32 and a second terminal coupled to ground line 30. Connected in this way, capacitor C2 can help hold reference voltage Vref at the second input of comparator 32.

Figure 4:
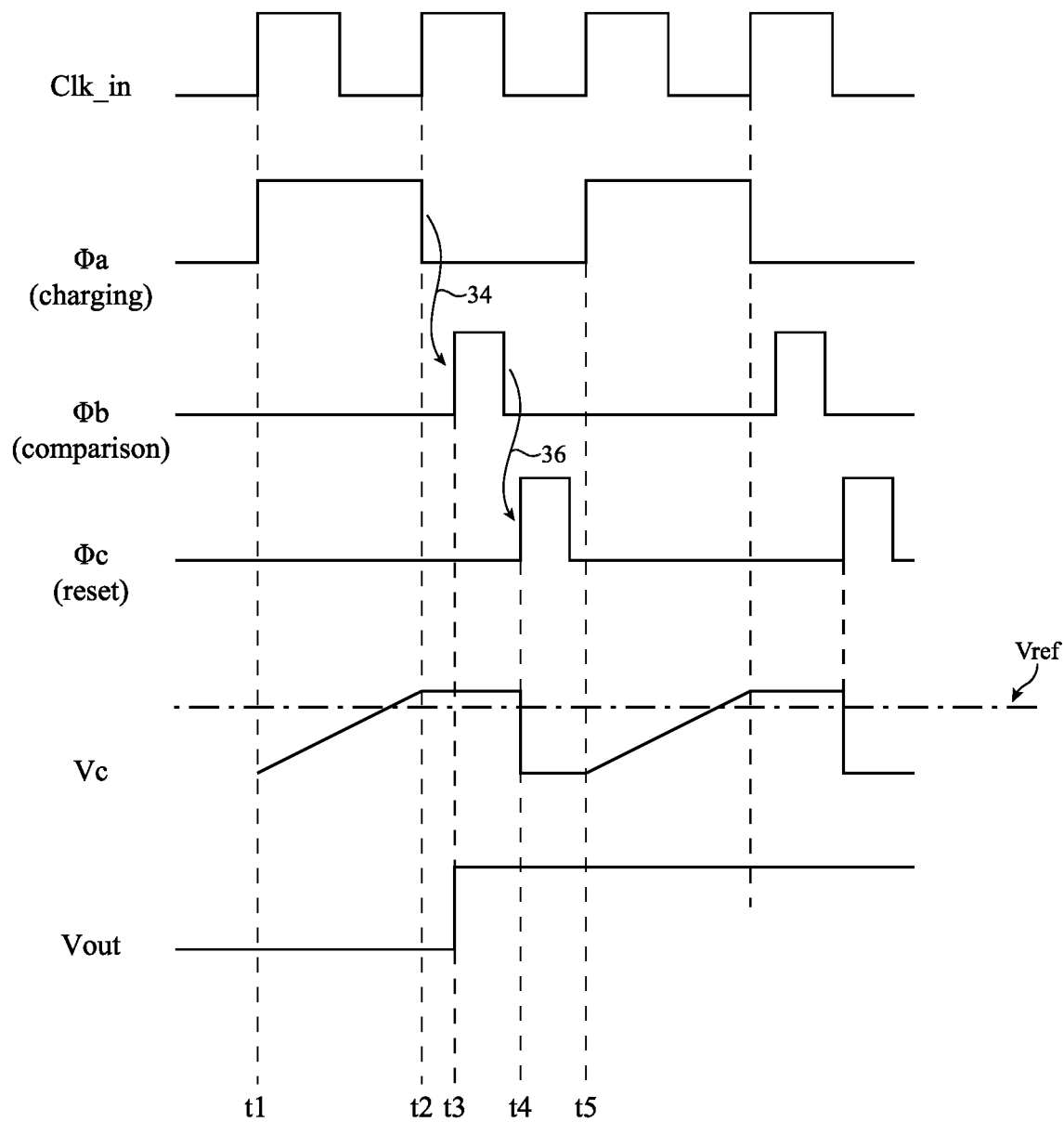
FIG. 4 is a timing diagram of illustrative waveforms involved in operating a voltage based frequency monitoring circuit of the type shown in FIG. 3 in accordance with some embodiments.

Control signals φa, φb, and φc may be generated using a clock phase generator 19 based on input clock signal Clk_in that is being monitored. The operation of voltage based frequency monitoring circuit 14 is best understood by illustration of the timing diagram of FIG. 4. In the example of FIG. 4, input clock signal Clk_in may be a square wave clock signal. This is merely illustrative. If desired, signal Clk_in may be a sinusoidal waveform or other periodic waveform. If desired, signal Clk_in may have a 50% duty cycle (as shown), a duty cycle that is greater than 50%, a duty cycle that is less than 50%, or any suitable duty cycle. Device configurations in which input clock signal Clk_in is a square wave with a 50% duty cycle are sometimes described herein as an example.

As shown in FIG. 4, control signal φa may be a periodic signal with half the frequency of input clock signal Clk_in. As an example, signal φa may be generated from clock signal Clk_in using a simple frequency divider or other circuit that can generate a control signal with half or other fractional frequency of signal Clk_in. Control signal φb may be a pulse signal that is triggered from a falling (negative) edge of signal φa, as indicated by arrow 34. Control signal φc may be a pulse signal that is triggered from a falling (negative) edge of signal φb, as indicated by arrow 36. Control signals φa, φb, and φc can be generated from clock signal Clk_in using clock phase generator 19 (see FIG. 3).

At time t1, input clock signal Clk_in rises, which triggers a rising clock edge in control signal φa. Signal φa may be high until time t2, which is the subsequent rising edge in clock signal Clk_in. During the time period from time t1 to t2 while signal φa is high, reference current Iref will flow through switch 22 to charge up capacitor C1 at a predetermined charging rate, so voltage Vc at node X will rise linearly from time t1 to t2. Signal φa is therefore sometimes referred to as a charging control signal, and the time period from t1 to t2 can be referred to and defined as a charging phase. At time t2, signal φa is driven low, so switch 22 is turned off and voltage Vc stored on capacitor C1 will remain at a constant level.

At time t3, control signal φb can be pulsed high. When signal φb is asserted (e.g., pulsed high), comparator 32 is enabled and will generate Vout depending on whether Vc is greater than or less than the reference voltage level Vref. In the example of FIG. 4, Vout is driven from a low voltage to a high voltage at time t3, which indicates that Vc exceeds the Vref level (see horizontal threshold line in the Vc waveform). This is however, merely illustrative. If input clock signal Clk_in were to have a higher frequency, the resulting clock period will shrink, which would effectively shorten the duration of the charging phase. If the frequency is high enough, the charging phase might be so short that Vc will not charge up to a voltage level exceeding Vref. In such scenarios, voltage Vout will remain deasserted at the output of comparator 32. Signal φb is therefore sometimes referred to as a comparison or comparator control signal, and the time period during which φb is high can be referred to and defined as as a comparison phase or a conversion phase.

At time t4, control signal φc can be pulsed high. When signal φc is asserted (e.g., pulsed high), switch 28 can be turned on to discharge capacitor C1. As a result, voltage Vc will be pull back to a low voltage level (e.g., driven back towards the ground voltage). During this time, switch 26 can also be turned on, which recharges capacitor C2 to Vref in case there has been any leakage at the second input of comparator 32 (e.g., capacitor resamples and holds Vref for the next clock cycle). Signal φc is therefore sometimes referred to as a reset control signal, and the time period during which φc is high can be referred to and defined as a reset phase. At time t5, a subsequent comparison cycle can repeat itself.

Operated in this way, a fast yet high-precision frequency detection scheme is provided where a voltage comparison is performed every clock cycle. This voltage based architecture thus enables a single cycle frequency monitoring to determine whether the frequency of the current input clock signal Clk_in is greater than or less than a reference frequency of voltage based frequency monitoring circuitry 14. The reference frequency is sometimes referred to as the threshold frequency or the detection frequency of frequency monitoring circuitry 14. In practice, however, multiple comparison cycles may be needed to reliably monitor the input frequency in the presence of circuit noise and input clock jitter. As an example, digital output logic 16 (see FIG. 2) can include a digital majority voting circuit that is configured to average out instantaneous errors that can arise due to random circuit noise, power supply noise, and clock jitter. Thus, the time it takes to detect the input clock frequency might only take a few input clock cycles.

The example of FIG. 3 uses the same reference current Iref to charge capacitor C1 at node X and to generate the reference voltage at node Y. By sharing the same input current Iref, frequency monitoring circuit 14 eliminates the need for a high precision current/voltage reference for the comparator. The detection threshold may depend only on the values of resistor R and capacitor C1 to a first order. This frequency to voltage conversion architecture can also help cancel out any low frequency noise or flicker associated with the reference current and voltage.

Figure 5:
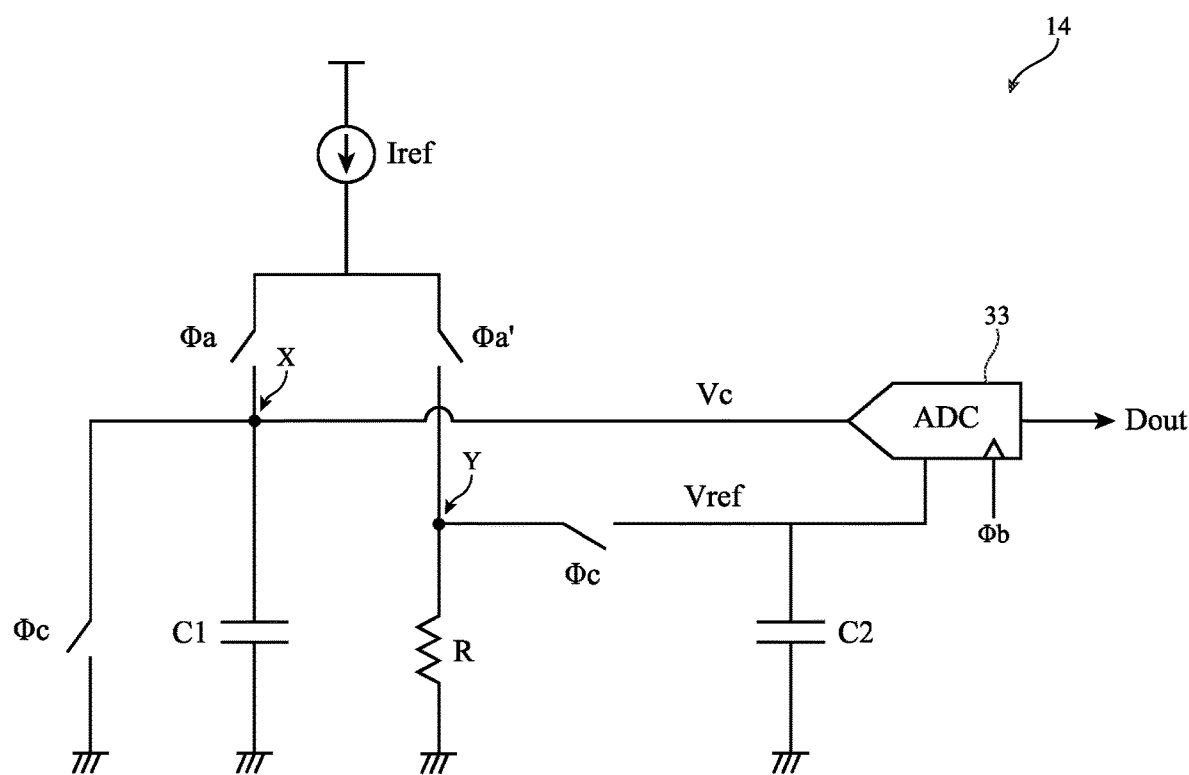
FIG. 5 is a circuit diagram of an illustrative voltage based frequency monitoring circuit having an analog-to-digital converter (ADC) output stage in accordance with some embodiments.

The example of FIG. 3 in which voltage based frequency monitoring circuit 14 includes a comparator 32 is merely illustrative and is not intended to limit the scope of the present embodiments. In other embodiments, the comparator can be replaced by a data converter such as analog-to-digital converter (ADC) 33 (see, e.g., FIG. 5). As shown in FIG. 5, analog-to-digital converter 33 may have a first input configured to receive voltage Vc from node X, a second input configured to receive reference voltage Vref, and a clock input configured to receive control signal $\phi$b. The first and second inputs of analog-to-digital converter 33 are sometimes referred to as first and second ADC inputs. Configured in this way, analog-to-digital converter 33 may generate a corresponding digital signal Dout that is equal to the ratio of Vc to Vref (e.g., Dout may be equal to Vc/Vref). Converter 33 may be part of digital output logic 16 (see FIG. 2).

Voltage based frequency monitoring circuit 14 is configured to compare the frequency of input clock signal Clk_in to a reference frequency. Assertion of Vout might indicate that the current Clk_in has a measured frequency that is less than the reference frequency, whereas deassertion of Vout might indicate that the current Clk_in has a measured frequency that is greater than the reference frequency. The reference frequency (sometimes referred to as a threshold frequency) may be selected or designed by tuning the resistance of resistor R and the capacitance of capacitor C1. The value of resistor R can, however, vary as a function of temperature. For example, poly resistors such as resistors formed using polysilicon or other silicon based material can exhibit a negative temperature coefficient (i.e., a rise in temperature can cause a reduction in resistance and vice versa). Since the accuracy of the frequency monitoring depends on the value of R and C1, any temperature drift at resistor R can be a major source of error for frequency monitoring circuit 14.

Figure 6:
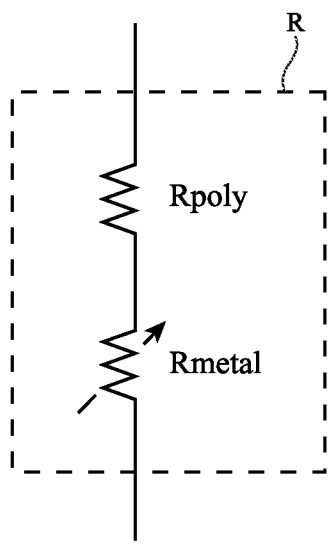
FIG. 6 is a diagram of a temperature compensated resistive circuit in accordance with some embodiments.

In accordance with some embodiments, resistor R in voltage based frequency monitoring circuit 14 can be implemented using a temperature compensated resistive circuit such as temperature compensated resistor R as shown in FIG. 6. In the example of FIG. 6, resistor R may include a poly resistor Rpoly coupled in series with a metal resistor Rmetal. Poly resistor Rpoly may exhibit a negative temperature coefficient, whereas metal resistor Rmetal may exhibit a positive temperature coefficient. By combining two different resistors with opposing temperature coefficients, the overall resistor R can exhibit a stable resistance even in the presence of temperature drifts. The example of FIG. 6 of a temperature compensated resistor is merely illustrative. If desired, resistor R can be implemented using other types of temperature dependent resistive components.

Figure 7:
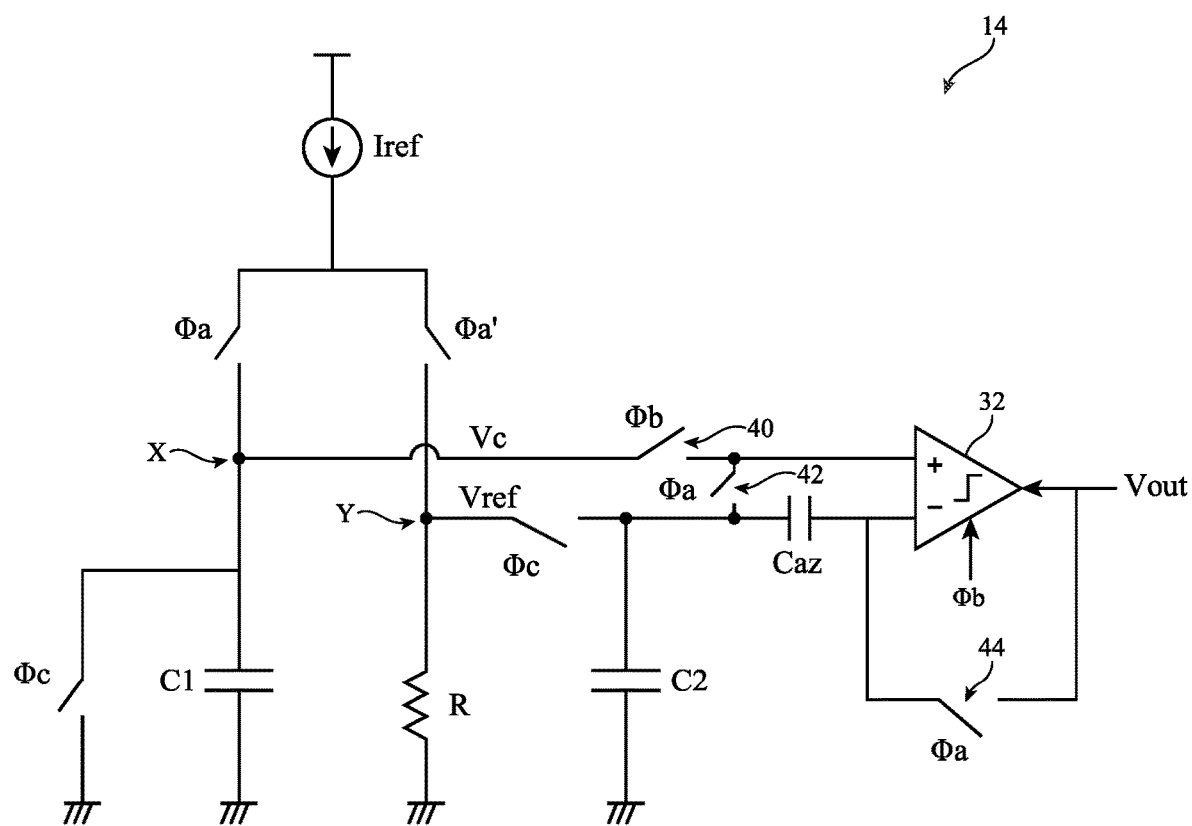
FIG. 7 is a circuit diagram of an illustrative voltage based frequency monitoring circuit having an auto-zero comparator in accordance with some embodiments.

The voltage based frequency monitoring circuit 14 can be subject to comparator offset (and drift in the comparator offset) and flicker noise. FIG. 7 shows another suitable embodiment of voltage based frequency monitoring circuit 14 that is provided with autozeroing (AZ) components that can help compensate for any drift in comparator offset while also mitigating flicker noise. As shown in FIG. 7, an additional feedback switch such as switch 44 may be coupled across the output and the second (−) input of comparator 32, an additional capacitor such as autozero capacitor Caz can be coupled in series at the second input of comparator 32, a switch 40 can be coupled between node X and the first (+) input of comparator 32, and a switch 42 can be coupled between the two inputs of comparator 32. In particular, switch 42 may have a first terminal coupled to the first input of comparator 32 and a second terminal coupled to capacitor C2.

Switches 40, 42, and 44 may be referred to collectively as autozero (AZ) or autozeroing switches. Switches 42 and 44 may be controlled by signal $\phi$a (e.g., the charging control signal), whereas switch 40 may be controlled by signal $\phi$b (e.g., the comparison control signal). As a result, switches 42 and 44 can be turned on during the charging phase to place comparator in a unity gain feedback arrangement so that the comparator offset is stored across capacitor Caz. Switch 40 can subsequently be activated during the comparison phase (sometimes also referred to as the conversion phase) so that capacitor Caz is connected in series with reference voltage Vref to cancel out any comparator offset and low frequency flicker noise. The use of such autozeroing circuitry is merely optional. The remaining structure and function of frequency monitoring circuit 14 of FIG. 7 is similar to that already described in connection with FIG. 3 and need not be reiterated in detail to avoid obscuring the present embodiment.

Figure 8:
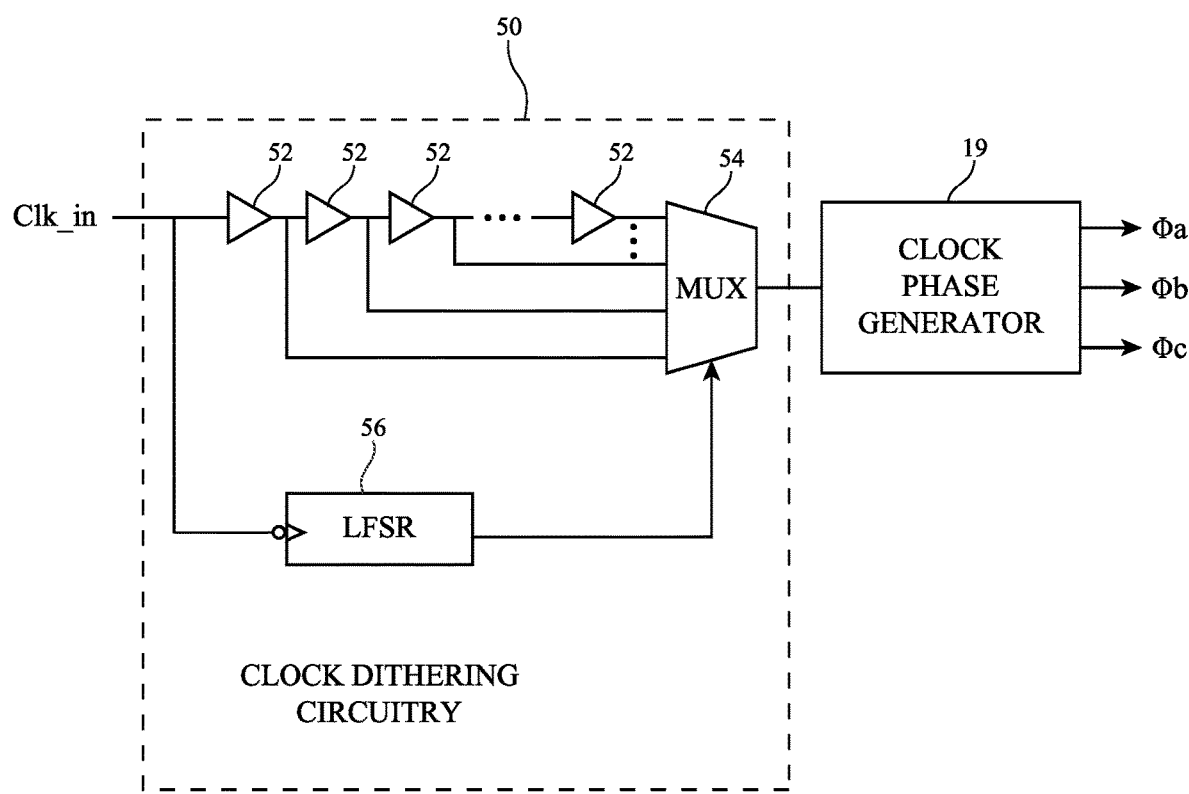
FIG. 8 is a diagram of illustrative clock dithering circuitry configured to generate control signals for a voltage based frequency monitoring circuit in accordance with some embodiments.

Another potential source of error is the power supply noise. The dominant path for power supply noise can come through the reference current source Iref. One way of reducing or mitigating the impact of such power supply noise is to dither the clock edges of the switch control signals. FIG. 8 is a diagram of illustrative clock dithering circuitry such as clock dithering circuitry 50 that can be used to dither the clock edges of input clock Clk_in so that the corresponding switch control signals $\phi$a, $\phi$b, and $\phi$c output from the clock phase generator 19 have rising/falling edges that are also dithered.

As shown in FIG. 8, clock dithering circuitry 50 may include a chain of delay circuits 52 (e.g., buffers, inverter, or other delay components), a multiplexing circuit such as multiplexer 54 having inputs connected to different tap points along the delay chain and having a control input configured to receive signals from a linear feedback shift register (LFSR) 56. Linear feedback shift register 56 may have a clock input configured to receive input clock signal Clk_in and an output on which a pseudo random number sequence is generated. By feeding the pseudo random number sequence generated by the LSFR 56 to the control input of multiplexer 54, the delay of Clk_in can be shuffled each clock cycle. This effectively changes the period of control signal φa every clock cycle.

By changing the duration of the charging phase every clock cycle and passing the output of comparator 32 through a digital majority voting circuit or through a digital averaging filter that can be included within digital output logic 16, the power supply rejection ratio of voltage based frequency monitoring circuit 14 can be improved. If desired, the delay cells 52 and the number of delay taps in the delay chain can be specifically designed to create a notch at any frequency of interest. Circuitry 50 can include two or more delay cells 52, 2-10 delay cells 52, 10-20 delay cells 52, 20-50 delay cells 52, or any desired number of delay cells with respective delay taps. For example, if it is known that the environment in which circuit 14 is to be operated contains an aggressor at a specific frequency fic, the delay chain within clock dithering circuitry 50 can be designed to create a notch (e.g., frequency rejection) at that aggressor frequency fx. The example of FIG. 8 in which clock dithering circuitry 50 uses a linear feedback shift register to control multiplexer 54 is merely illustrative. In general, clock dithering circuitry 50 can be implemented using other types of pseudo random number generator or other random number generator.

Figure 9:
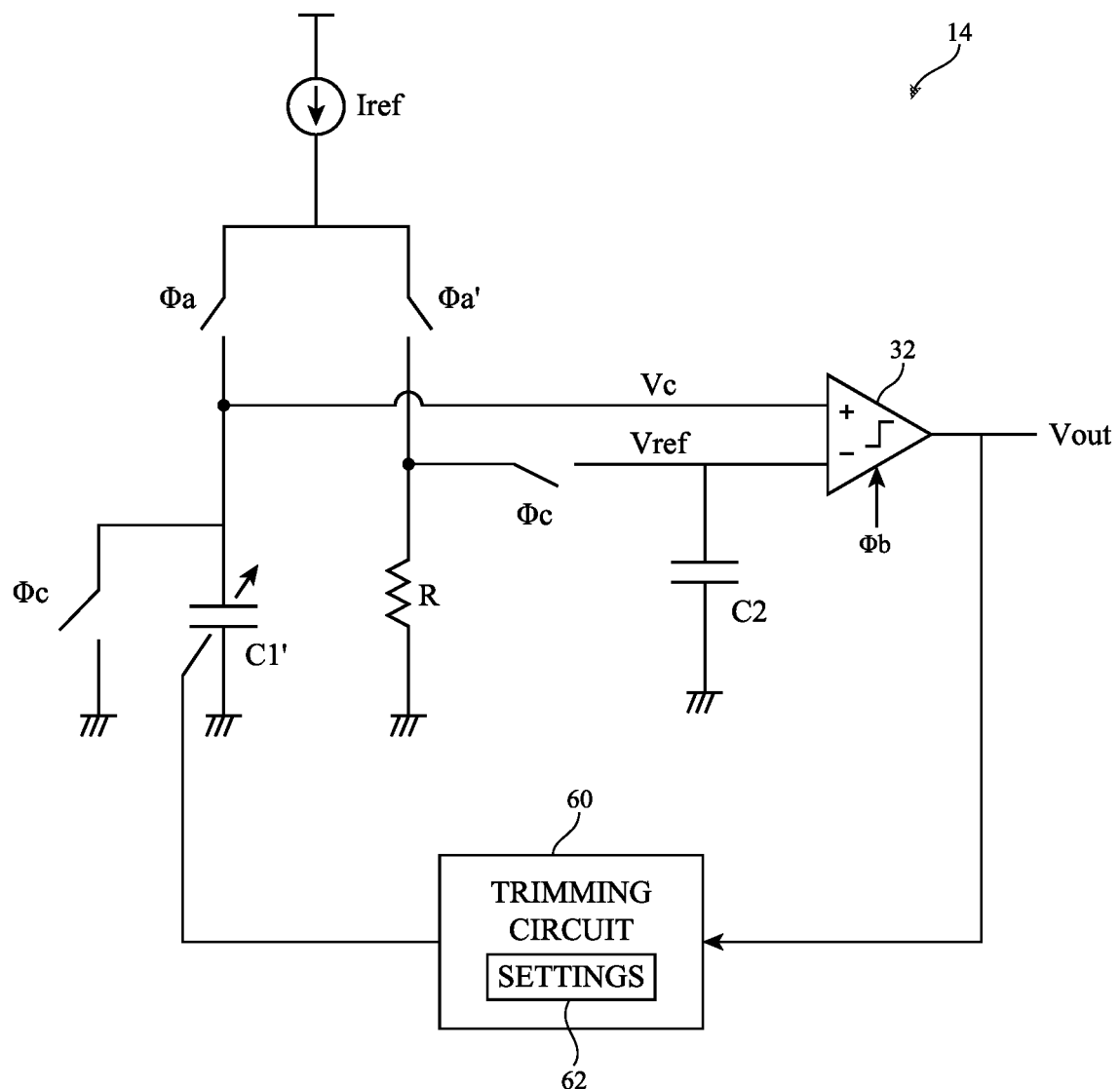
FIG. 9 is a circuit diagram of an illustrative voltage based frequency monitoring circuit having capacitance trimming circuit in accordance with some embodiments.

As described above, the reference (threshold) frequency of voltage based frequency monitoring circuit 14 may be a function of the resistance of resistor R and the capacitance of capacitor C1. Since it is possible for the RC values to vary due to processing variations, a one-time (factory) calibration operation can be performed to trim (adjust) the value of capacitor C1 so that the combined RC value is tuned to the desired reference frequency. FIG. 9 shows an embodiment of voltage based frequency monitoring circuit 14 that includes a trimming circuit such as trimming circuit 60. Trimming circuit 60 can monitor voltage Vout from the output of comparator 32 and adjust the capacitance of capacitor C1 based on settings 62. Capacitor C1 may be a capacitive bank or an array of capacitors that are selectively activated.

For example, trimming circuit 60 may be a finite state machine configured to perform a series of calibration operations. The calibration operations can include first providing an input clock signal with a known input frequency (e.g., a known input frequency that is equal to the desired reference/threshold/detection frequency). The desired threshold frequency can be accurately programmed to the required level by ratiometrically adjusting the resistance of R. The trimming circuit 60 can first set the capacitance of C1 to a mid-code level for settings 62. If the comparator output Vout is low, then the combined RC value is greater than the clock period of the input clock signal. Conversely, if the comparator output Vout is high, then the combined RC value is less than the clock period of the input clock signal. Trimming circuit 60 can perform a binary search or other iterative search algorithm to successively determine the next code for settings 62 such that the combined RC value is equal to the desired time period corresponding to the target reference/threshold frequency. Trimming circuit 60 is therefore sometimes referred to as a calibration circuit, and settings 62 can be referred to as a calibrated (factory) capacitor setting. The use of trimming/calibration circuit 60 is optional.

Figure 10:
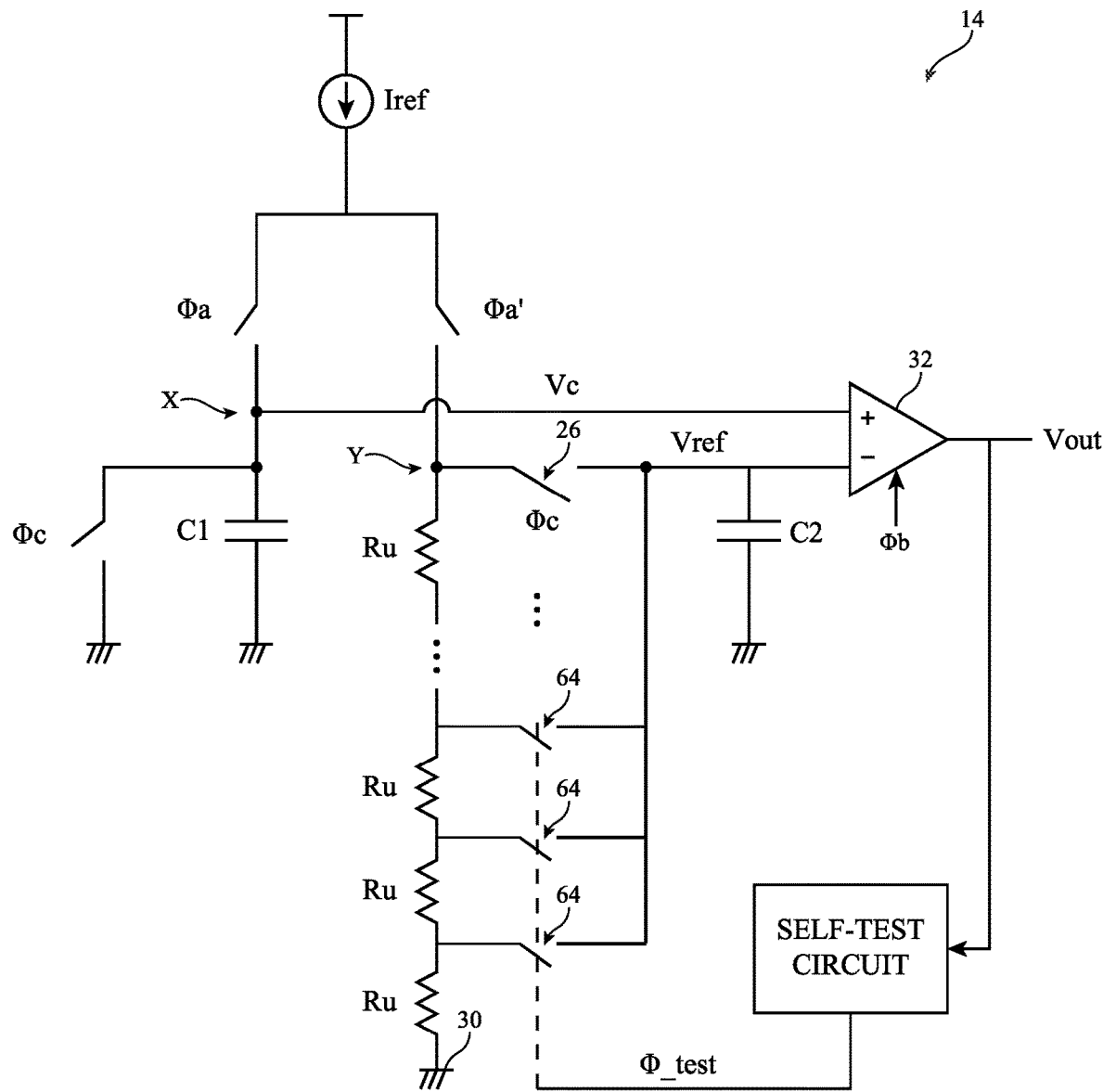
FIG. 10 is a circuit diagram of an illustrative voltage based frequency monitoring circuit having a self-test sub-circuit in accordance with some embodiments.

In certain embodiments, self-testing techniques can also be provided to check or verify the combined RC value. FIG. 10 shows one way of performing a self-test method. As shown in FIG. 10, voltage based frequency monitoring circuit 14 can be provided with a self-test circuit 66 having an input configured to receive Vout from the output of comparator 32 and an output for adjusting the pull-down resistance at node Y. As shown in FIG. 10, a resistive ladder including a plurality of unit resistors Ru can be coupled in series between node Y and ground line 30. The second (−) input of comparator 32 can be selectively coupled to one of the tap points along the resistive ladder by activating one of switches 64. Switches 64 can be controlled by signal φ_test output by self-test circuit 66.

Configured in this way, self-test circuit 66 can sequentially select different tap points along the resistive ladder (e.g., by connecting the second input of the comparator to different nodes along the ladder) to move the threshold frequency ratiometrically while the frequency of the input clock signal is kept constant. From a system-level perspective, this has the same effect as keeping the threshold frequency fixed and moving the input clock frequency. Self-testing operations can be performed one or more times in the factory prior to shipping device 10 to ensure that the combined RC value is tuned to the reference frequency. The remaining structure and function of frequency monitoring circuit 14 of FIG. 10 is similar to that already described in connection with FIG. 3 and need not be reiterated in detail to avoid obscuring the present embodiment.

Figure 11:
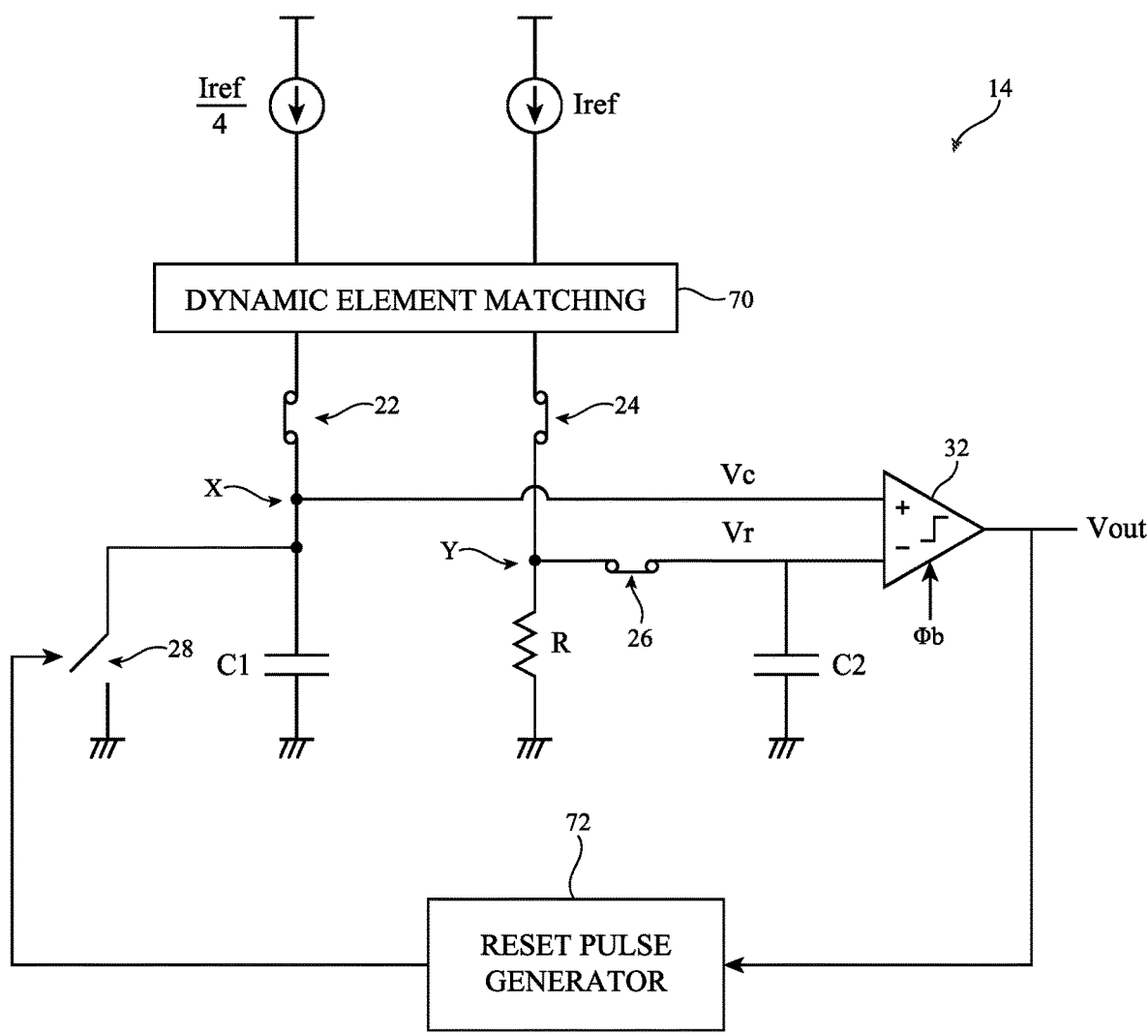
FIG. 11 is a circuit diagram of an illustrative voltage based frequency monitoring circuit configured as a relaxation oscillator in accordance with some embodiments.

FIG. 11 shows another way of performing a self-test method. As shown in FIG. 11, voltage based frequency monitoring circuit 14 can be provided with a pulse generator such as reset pulse generator 72 connected in a feedback loop. Reset pulse generator 72 may have an input configured to receive voltage Vout from the output of comparator 32 and an output on which a reset pulse signal can be provided to reset switch 28. Reset pulse generator 72 can be configured to generate a short pulse at its output (e.g., a pulse signal having a duration that is less than 1 ns, less than 5 ns, less than 10 ns, 10-50 ns, etc.) that enables switch 28 to periodically discharge capacitor C1 whenever Vout toggles or in response to detecting a rising and/or falling edge in Vout. Switches 22, 24, and 26 can all be activated (turned on) at the same time. Moreover, two different reference currents such as Iref and Iref/4 can be selectively provided to nodes X and Y via dynamic element matching circuit 70. Dynamic element matching circuit 70 can rotate or alternate the currents that are provided to nodes X and Y.

Arranged in this way, frequency monitoring circuit 14 is configured to operate as a relaxation oscillator. Current Iref/4 can be used to keep the oscillation frequency low. The scaling factor of ¼ (where one of the reference current branches is divided by four) in the example of FIG. 11 is merely illustrative. If desired, the scaling factor for one of the reference current branches can be ½, ⅓, ⅕, ⅔, ¾, other fractional values, or even 1 (as examples). A smaller scaling factor will generally decrease the oscillation frequency of the relaxation oscillator, which can reduce the error or increase the accuracy of the relaxation oscillator. The resulting oscillation frequency of this relaxation oscillator will be a function of the combined RC values of components R and C1. The output of comparator 32 can be connected to a frequency counter, an oscilloscope, or other frequency measurement circuit to measure the frequency of the relaxation circuit. This measured frequency can then be used to compute the R and/or C1 values. If desired, other ways of configuring voltage based frequency monitoring circuit 14 as an oscillating circuit or a relaxation oscillator can also be employed.

The embodiments of FIGS. 3-11 are not mutually exclusive and can be implemented in any desired combination. As an example, voltage based frequency monitoring circuit 14 can have both the trimming circuit 60 of FIG. 9 and the self-test circuit 66 of FIG. 10. As another example, voltage based frequency monitoring circuit 14 can include the self-test circuit 66 of FIG. 10 and also the circuitry shown in FIG. 11 for operating circuit 14 in a relaxation oscillator mode for performing self-test. As yet another example, voltage based frequency monitoring circuit 14 can include the temperature compensated resistor of FIG. 6, the autozeroing circuitry of FIG. 7, the clock dithering circuitry of FIG. 8, the trimming circuit of FIG. 9, and/or the self-test circuitry of FIGS. 10 and 11.

The voltage based frequency monitoring circuit 14 of the type described in connection with FIGS. 2-11 might not be reliable at extreme operating frequencies. For instance, if the input clock frequency is too high, the comparator might not be able to finish the comparison, or if the input clock frequency is too low, leakage currents at the inputs of the comparator and/or other internal nodes might affect the accuracy of the frequency monitoring.

The various switches such as switches 22, 24, 26, 28, 40, 42, 44, and 64 shown in the embodiments of FIGS. 3, 5, 7, 9, 10, and 11 can be implemented using any type(s) of transistor technology. For example, these switches can be implemented as one or more metal-oxide-semiconductor field-effect transistors (MOSFETs), fin field-effect transistors (FinFETs), gate-all-around field-effect transistors (GAAFETs), multi-bridge-channel field-effect transistors (MBCFETs), junction-gate field-effect transistors (JFETs), bipolar junction transistors (BJTs), some combination of these transistors, and/or other types of transistor-based switching devices.

Figure 12A:
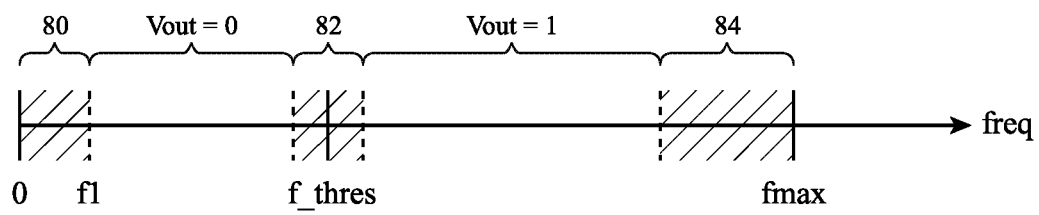
FIG. 12A is a diagram illustrating a suitable operating frequency range of a voltage based frequency monitoring circuit in accordance with some embodiments.

FIG. 12A is a diagram showing an exemplary operating frequency range of voltage based frequency monitoring circuit 14. As shown in FIG. 12A, voltage based frequency monitoring circuit 14 may have difficulty reliably generating an accurate/consistent output at very low frequencies (see frequency range 80 from 0 Hz to fl), at very high frequencies (see frequency range 84 near the maximum operating frequency fmax), and also near the threshold/detection frequency (see frequency range 82 around the detection frequency). In frequency ranges 80, 82, and 84, the comparator output Vout can be unreliable and can sometimes yield false positives or false negatives. Voltage based frequency monitoring circuit 14 can reliably generate a comparator output Vout of "0" when the input clock frequency is between ranges 80 and 82 and can reliably generate a comparator output Vout of "1" when the input clock frequency is between ranges 82 and 84.

Figure 12B:
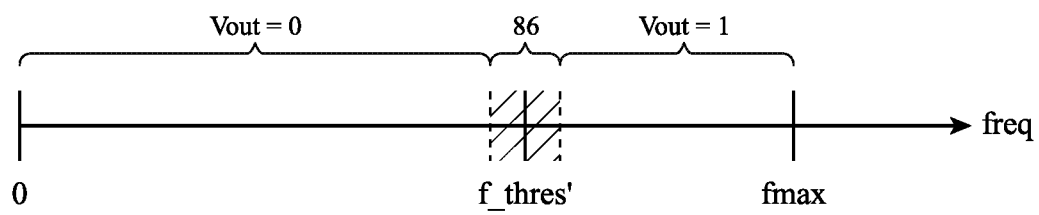
FIG. 12B is a diagram illustrating a suitable operating frequency range of a coarse high frequency monitoring circuit in accordance with some embodiments.

A coarse frequency monitoring circuit 18 (see FIG. 2) can be used to overcome the limitations of voltage based frequency monitoring circuit 14. Coarse frequency monitoring circuit 18 can be configured as a coarse high frequency monitor having an exemplary operating frequency range as shown in FIG. 12B. The coarse high frequency monitoring circuit may only be unreliable in frequency range 86 (e.g., near the threshold/detection frequency f_thres' of the coarse high frequency monitor) but can reliably generate a comparator output Vout of "0" when the input clock frequency is between 0 Hz and range 86 and can reliably generate a comparator output Vout of "1" when the input clock frequency is between range 86 and fmax.

Figure 12C:
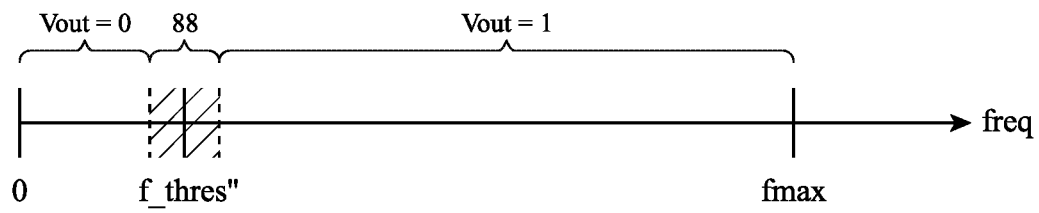
FIG. 12C is a diagram illustrating a suitable operating frequency range of a coarse low frequency monitoring circuit in accordance with some embodiments.

Coarse frequency monitoring circuit 18 can also be configured as a coarse low frequency monitor having an exemplary operating frequency range as shown in FIG. 12C. The coarse low frequency monitoring circuit may only be unreliable in frequency range 88 (e.g., near the threshold/detection frequency f_thres" of the coarse low frequency monitor) but can reliably generate a comparator output Vout of "0" when the input clock frequency is between 0 Hz and range 88 and can reliably generate a comparator output Vout of "1" when the input clock frequency is between range 88 and fmax.

The detection frequency f_thres" of the coarse low frequency monitor is substantially less than the detection frequency f_thres' of the high frequency monitor. Coarse frequency monitoring circuit 18 can include a coarse high frequency monitoring subcircuit and/or a coarse low frequency monitoring subcircuit. Using voltage based frequency monitoring circuit 14 in combination with such coarse frequency monitoring circuit 18 allows frequency monitoring circuitry 12 to provide fast frequency monitoring capabilities across an entire range of frequencies from 0 Hz to fmax without compromising on speed or accuracy.

Figure 13:
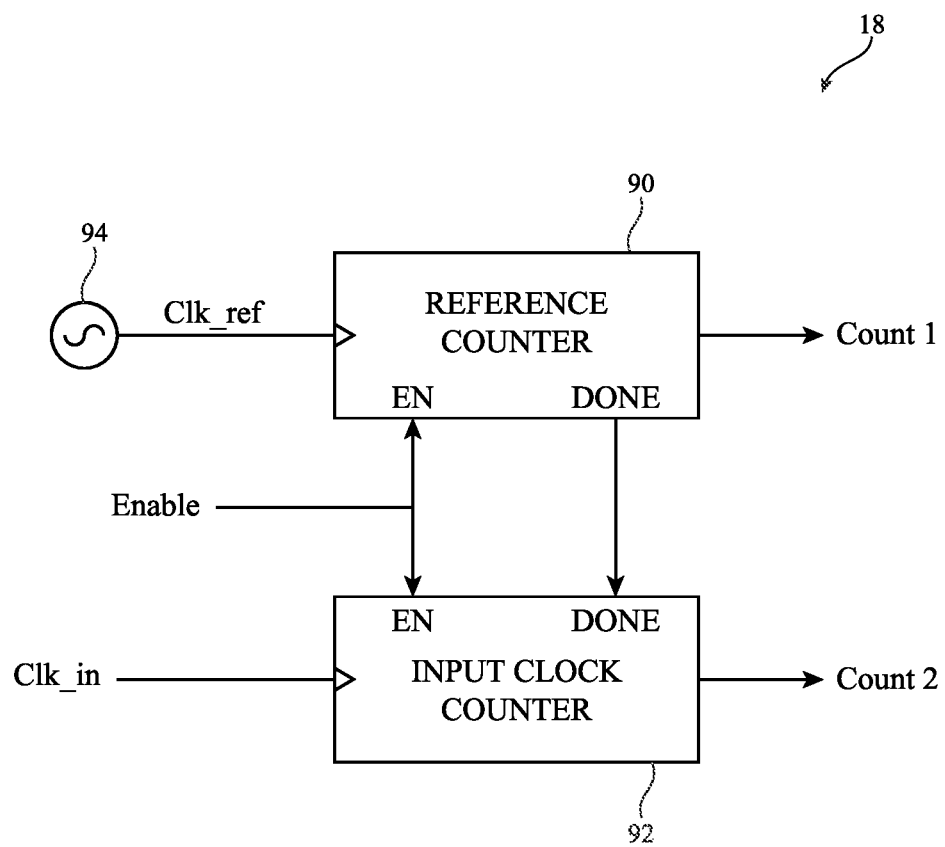
FIG. 13 is a diagram of an illustrative coarse frequency monitoring circuit in accordance with some embodiments.

FIG. 13 is a diagram of an illustrative coarse frequency monitoring circuit 18 in accordance with some embodiments. The circuit of FIG. 13 can represent a coarse high frequency monitoring circuit or a coarse low frequency monitoring circuit. As shown in FIG. 13, coarse frequency monitoring circuit may include a reference counter circuit such as reference counter 90 and an input clock counter circuit such as input clock counter 92. Reference counter 90 may have a clock input configured to receive a reference clock signal Clk_ref from a reference oscillator 94, an enable input configured to receive an enable signal, and an output on which a first count value Count1 can be generated. Input clock counter 92 may have a clock input configured to receive input clock signal Clk_in, an enable input configured to receive the enable signal, and an output on which a second count value Count2 can be generated. Count outputs Count1 and/or Count2 can be provided to digital output logic 16 for further computation.

During operation of coarse frequency monitoring circuit 18 begins when the enable signal is asserted. Once the enable signal goes high, both reference counter 90 and the input clock counter will start counting the rising (or falling) edges of their respective clock input signals. Once the reference counter 90 reaches its maximum value (e.g., when Count1 reaches 2^N−1, where counter 90 has a bit width of N), reference counter 90 will assert a "done" signal. Assertion of this done signal may stop the counting at input clock counter 92 and freeze the current Count2 value. The frequency of input clock signal Clk_in can then be computed using the following equation:

$$fin = fref\left(\frac{Count2}{2^N}\right) \quad (1)$$

where fin represents the frequency of the input clock signal Clk_in, where fref represents the frequency of the reference clock signal Clk_ref, where Count2 is the frozen output of input clock counter 92 when the done signal is asserted from counter 90, and where N is equal to the resolution of counter 90. Frequency fref can be much lower than fin (e.g., fref can be less than 10% of fin, less than 1% of fin, less than 0.1% of fin, less than 0.01% of fin, etc.). The computation of fin using equation 1 can be performed at digital output logic 16 (see FIG. 1).

Since coarse frequency monitoring circuit 18 is needed to operate only at very high and very low frequencies, circuit 18 need not be very accurate. Because of this relaxed accuracy requirement, the speed of conversion of coarse frequency monitoring circuit 18 can be high. Moreover, the relaxed accuracy requirement also makes the design of reference oscillator 94 fairly simple with low area and power. For example, reference oscillator 94 can be a ring oscillator.

The foregoing is merely illustrative and various modifications can be made to the described embodiments. The foregoing embodiments may be implemented individually or in any combination.

What is claimed is:

1. Frequency monitoring circuitry comprising:
   a comparator having a first comparator input and a second comparator input;
   a capacitor coupled to the first comparator input;
   a resistor selectively coupled to the second comparator input; and
   a current source configured to provide a reference current to the capacitor during a first time period and to provide the reference current to the resistor during a second time period different than the first time period.

2. The frequency monitoring circuitry of claim 1, further comprising:
   a first switch coupled between the current source and the capacitor; and
   a second switch coupled between the current source and the resistor.

3. The frequency monitoring circuitry of claim 2, wherein the first switch is controlled by a control signal and wherein the second switch is controlled by an inverted version of the control signal.

4. The frequency monitoring circuitry of claim 2, further comprising:
   a third switch coupled between the resistor and the second comparator input.

5. The frequency monitoring circuitry of claim 4, further comprising:
   a fourth switch configured to reset the capacitor.

6. The frequency monitoring circuitry of claim 5, further comprising:
   an additional capacitor coupled to the second comparator input.

7. The frequency monitoring circuitry of claim 5, further comprising:
   a clock phase generator configured to receive an input clock signal having an input clock frequency and configured to output signals for controlling the first, second, third, and fourth switches.

8. The frequency monitoring circuitry of claim 7, wherein the comparator is configured to output a first voltage in response to detecting that the input clock frequency is greater than a reference frequency and to output a second voltage different than the first voltage in response to detecting that the input clock frequency is less than the reference frequency.

9. The frequency monitoring circuitry of claim 7, further comprising:
   clock dithering circuitry configured to dither the input clock signal that is provided to the clock phase generator.

10. The frequency monitoring circuitry of claim 1, wherein the resistor comprises a polysilicon resistor and a metal resistor.

11. The frequency monitoring circuitry of claim 1, further comprising:
    a first autozero switch coupled across the second comparator input and an output of the comparator;
    a second autozero switch having a first terminal coupled to the first comparator input and having a second terminal coupled to the second comparator input; and
    an autozero capacitor coupled to the second comparator input.

12. The frequency monitoring circuitry of claim 1, further comprising:
    a trimming circuit configured to tune the capacitor using a calibrated setting.

13. The frequency monitoring circuitry of claim 1, further comprising:
    a self-test circuit configured to selectively couple the second comparator input to a respective tap point along a resistive ladder.

14. The frequency monitoring circuitry of claim 1, further comprising:
    a reset pulse generator coupled to the comparator and configured to generate an output signal for discharging the capacitor; and
    a dynamic element matching circuit configured to selectively provide two different reference currents to the capacitor and the resistor.

15. Circuitry comprising:
    a voltage based frequency monitoring circuit configured to receive an input clock signal having an input clock frequency and to generate a corresponding output voltage having a first value when the input clock frequency is greater than a reference frequency and having a second value when the input clock frequency is less than the reference frequency;
    a coarse frequency monitoring circuit configured to receive the input clock signal and to output one or more count values; and
    an output circuit configured to generate a digital output based on the output voltage from the voltage based frequency monitoring circuit when the input clock frequency is within a first set of frequencies and based on the one or more count values from the coarse frequency monitoring circuit when the input clock frequency is within a second set of frequencies different than the first set of frequencies.

16. The circuitry of claim 15, wherein the voltage based frequency monitoring circuit comprises:
    a comparator;
    a capacitor coupled to a first input of the comparator;
    a resistor selectively coupled to a second input of the comparator; and
    a first switch configured to selectively convey a reference current to the capacitor; and
    a second switch configured to selectively convey the reference current to the resistor.

17. The circuitry of claim 15, wherein the voltage based frequency monitoring circuit comprises:
    an analog-to-digital converter;
    a capacitor coupled to a first input of the analog-to-digital converter;
    a resistor selectively coupled to a second input of the analog-to-digital converter; and
    a first switch configured to selectively convey a reference current to the capacitor; and
    a second switch configured to selectively convey the reference current to the resistor.

18. The circuitry of claim 15, wherein the coarse frequency monitoring circuit comprises:
    a reference counter configured to receive a reference clock signal and to output a done signal; and an input clock counter configured to receive the input clock signal, to receive the done signal from the reference counter, and to generate a count value that is used to compute the input clock frequency.

19. The circuitry of claim 18, further comprising:
a ring oscillator configured to generate the reference clock signal.

20. Frequency monitoring circuitry comprising:
an analog-to-digital converter (ADC) having a first ADC input and a second ADC input;
a first capacitor coupled to the first ADC input;
a resistor selectively coupled to the second ADC input;
a second capacitor coupled to the second ADC input;
a first switch configured to pass a reference current to the first capacitor;
a second switch configured to pass the reference current to the resistor; and
a third switch configured to discharge the first capacitor.

* * * * *